US006629849B2

(12) United States Patent
Yu

(10) Patent No.: US 6,629,849 B2
(45) Date of Patent: Oct. 7, 2003

(54) ROTATABLY MATED CONNECTOR COUPLE

(75) Inventor: Hung-Chi Yu, Hsi-Chih (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/112,974

(22) Filed: Mar. 28, 2002

(65) Prior Publication Data

US 2003/0119342 A1 Jun. 26, 2003

(30) Foreign Application Priority Data

Dec. 26, 2001 (TW) ...................................... 90222990 U

(51) Int. Cl.$^7$ ........................ H01R 12/00; H01R 13/28; H01R 25/00; H01R 13/62; H05K 1/00

(52) U.S. Cl. ........................... 439/74; 439/65; 439/288; 439/326

(58) Field of Search ............................ 439/74, 288, 65, 439/326, 60, 924.1

(56) References Cited

U.S. PATENT DOCUMENTS 4,832,617 A * 5/1989 Brown ....................... 439/326
5,098,311 A * 3/1992 Roath et al. ................ 439/295
6,210,209 B1 * 4/2001 Wu et al. ................... 439/495

* cited by examiner

*Primary Examiner*—Chandrika Prasad
(74) *Attorney, Agent, or Firm*—Wei Te Chung

(57) ABSTRACT

A connector couple includes a plug connector and a receptacle connector. The plug connector includes a housing and a plurality of first and second terminals. The housing defines a cutout and a slot in communication with the cutout and therefore forms first and second side walls. The first and second terminals are received in inner sides of the first and second side walls respectively. The receptacle connector includes a housing and a plurality of terminals received in the housing. A protruding wall extends from the housing and is received in the slot of the plug connector. The cutout of the plug connector provides access to the protruding wall of the receptacle connector to extend into the slot of the plug connector during the plug connector rotatably mating with the receptacle connector.

7 Claims, 15 Drawing Sheets

ROTATABLY MATED CONNECTOR COUPLE

BACKGROUND OF THE INVENTION

1. Field of the Invention

The present invention relates to electrical connectors, and particularly to a connector couple rotatably mated with each other.

2. Prior Art

Electrical connectors are required in electronic devices for ready connection between different electronic devices or components. As one of typical electrical connectors, board to board connector couples are mounted on different printed circuit boards (PCBs) for electrical connection therebetween.

Referring to FIG. 1, a conventional connector couple includes a plug connector 50 and a receptacle connector 60 respectively mounted on two PCBs. The plug connector 50 and the receptacle connector 60 respectively include housings 51, 61, a plurality of terminals 52, 62 received in the housing 51, 61. Two side walls 53 extend symmetrically from the plug housing 51 thereby defining a slot 54 therebetween. A projecting wall 64 extends from the receptacle housing 61 matingly received in the slot 54 of the plug connector 50.

However, the plug connector 50 can only mate with the receptacle connector 60 along a direction. This means the plug connector 50 and the receptacle connector 60 are not fit to the situation that the two connector 50, 60 are required to rotatably mate with each other.

SUMMARY OF THE INVENTION

Accordingly, an object of the present invention is to provide a connector couple which is rotatably mated with each other.

To achieve the above-mentioned object, a connector couple in accordance with the present invention includes a plug connector and a receptacle connector. The plug connector includes a housing and a plurality of first and second terminals. The housing defines a cutout and a slot in communication with the cutout and therefore forms first and second side walls. The first and second terminals are received in inner sides of the first and second side walls respectively. The receptacle connector includes a housing and a plurality of terminals received in the housing. A protruding wall extends from the housing and is received in the slot of the plug connector. The cutout of the plug connector provides access to the protruding wall of the receptacle connector to extend into the slot of the plug connector during the plug connector rotatably mating with the receptacle connector.

Other objects, advantages and novel features of the present invention will be drawn from the following detailed description of a preferred embodiment of the present invention with attached drawings, in which:

DETAILED DESCRIPTION OF THE PREFERRED EMBODIMENT

Figure 1:
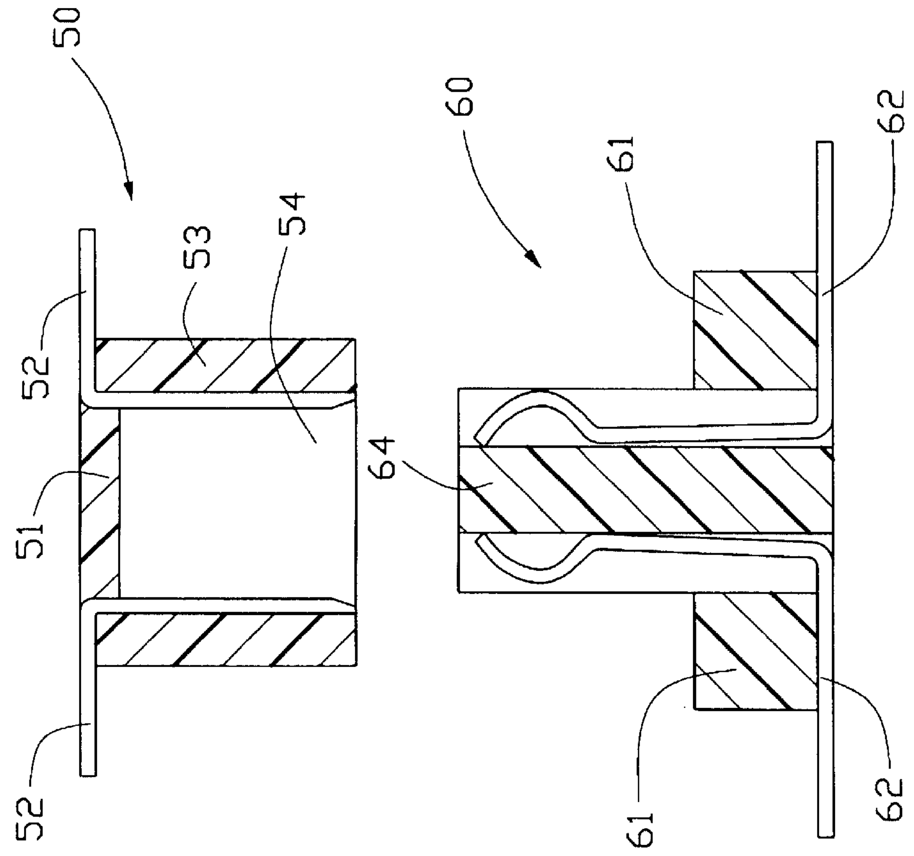
FIG. 1 (PRIOR ART)
FIG. 1 is an exploded view of a conventional connector couple.
Figure 2:
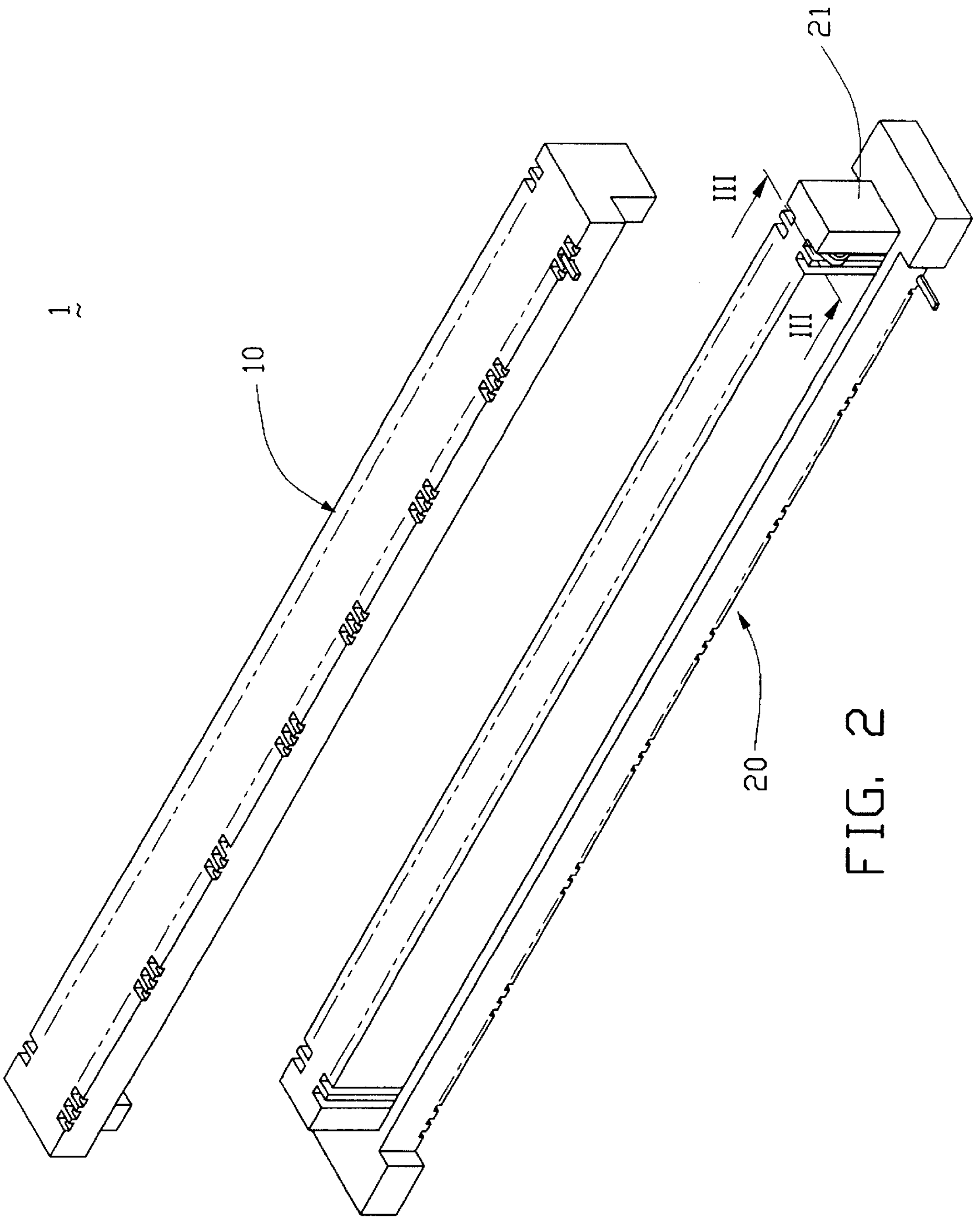
FIG. 2 is an exploded view of a connector couple in accordance with the present invention.
Figure 3:
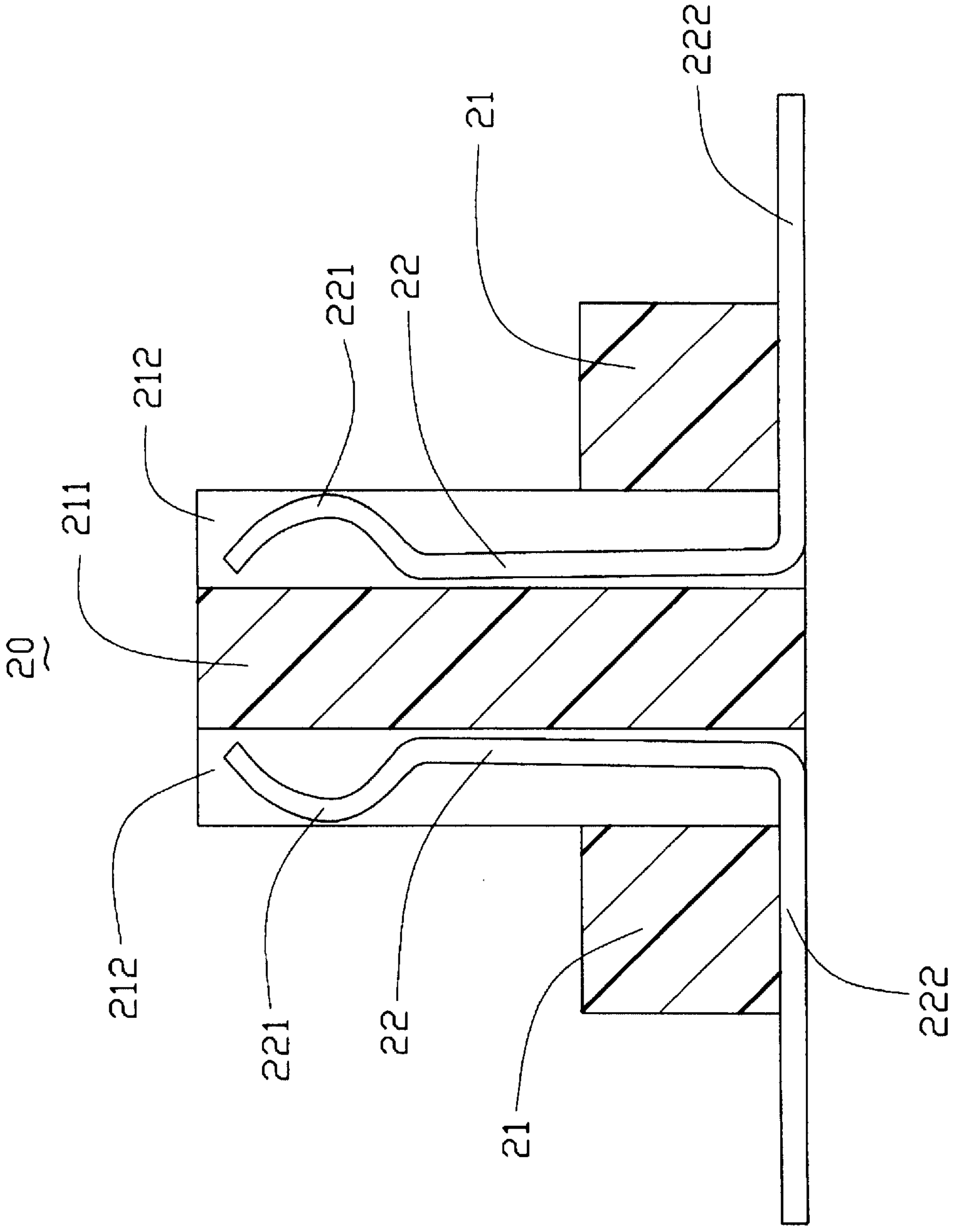
FIG. 3 is a crosssectional view of a receptacle connector taken along line III—III of FIG. 2.

Referring to FIGS. 2 and 3, a connector couple 1 in accordance with the present invention includes a plug connector 10 and a receptacle connector 20. The receptacle connector 20 includes a housing 21 and a plurality of terminals 22. An elongate protruding wall 211 extends from the housing 21. A plurality of passages 212 is defined in opposite sides of the protruding wall 211 and receives the terminals 22 therein. Each contact 22 includes an arcuate mating portion 221 and a soldering portion 222.

Figure 4:
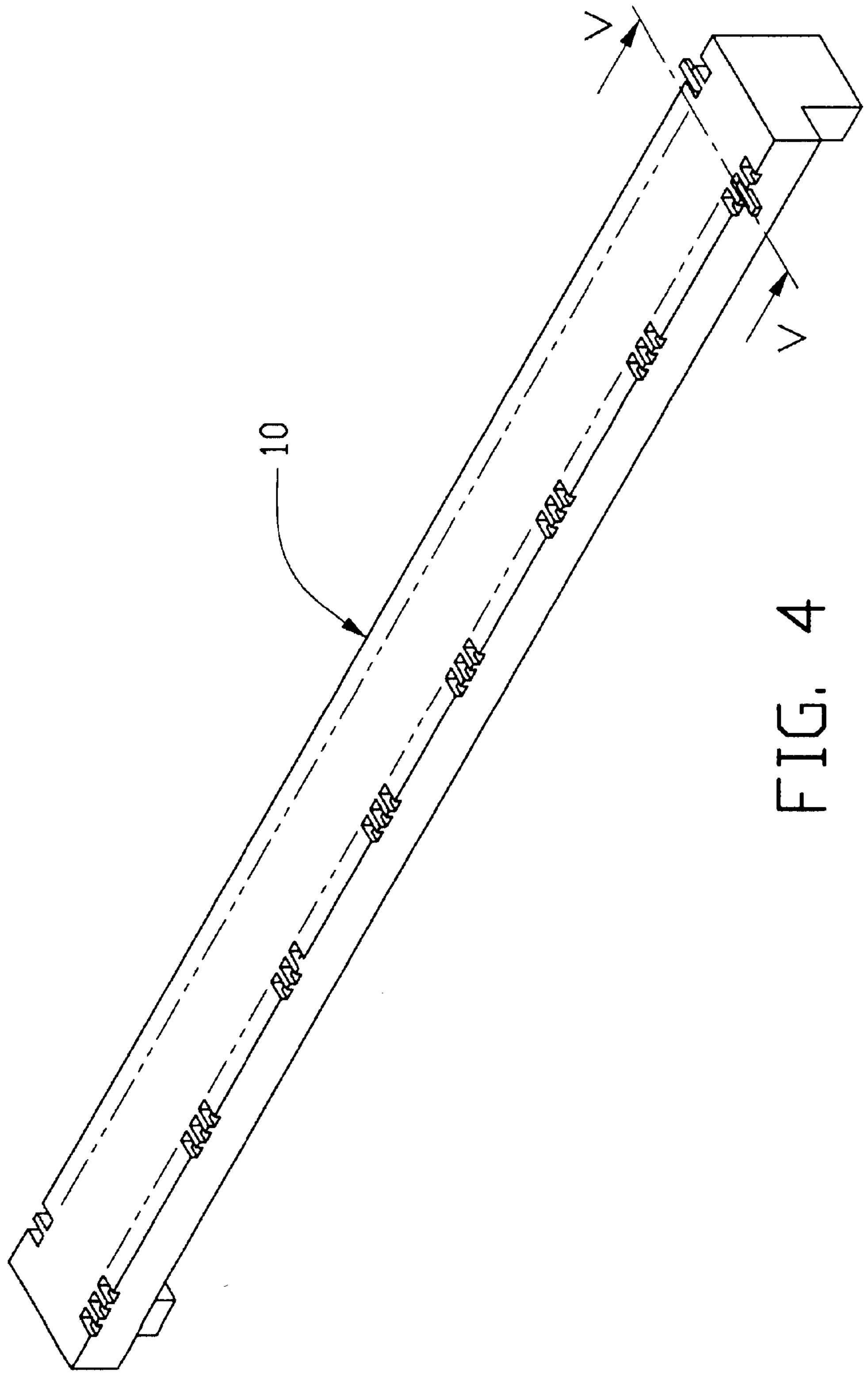
FIG. 4 is a perspective view of a plug connector of FIG. 2.
Figure 5:
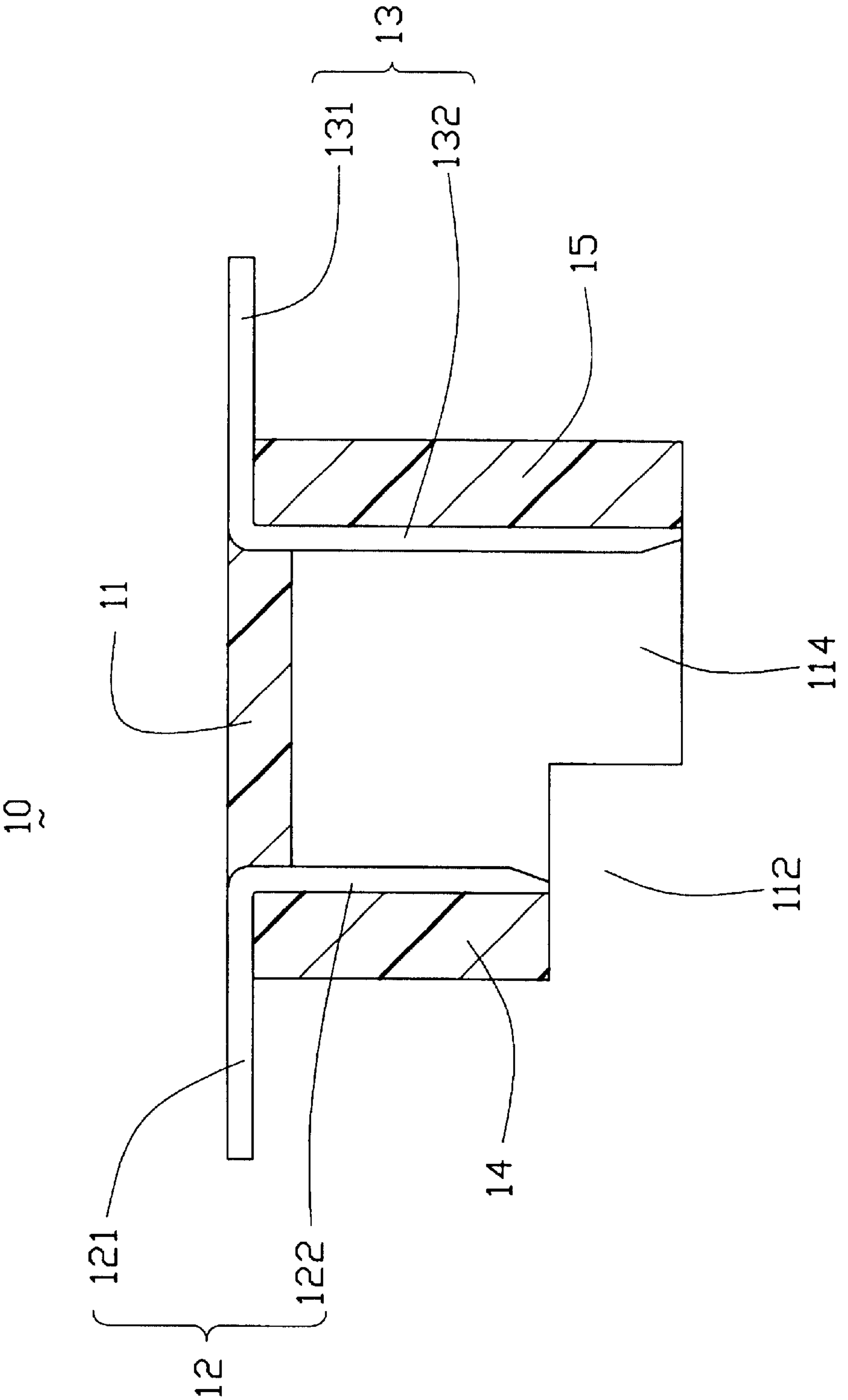
FIG. 5 is a crosssectional view of the plug connector taken along line V—V of FIG. 4.

Referring to FIGS. 4 and 5, the plug connector 10 includes a housing 11 and a plurality of first and second terminals 12, 13. The housing 11 defines an elongate cutout 112 and an elongate slot 114 in communication with the elongate cutout 112, and therefore forms opposite first and second side walls 14, 15. The cutout 112 makes the first side wall 14 shorter than the second side wall 15. Each first terminal 12 includes a soldering portion 121 and a mating portion 122 received in an inner side of the first side wall 14. Each second terminal 13 includes a soldering portion 131 and a mating portion 132 received in an inner side of the second side wall 15.

Figure 6A:
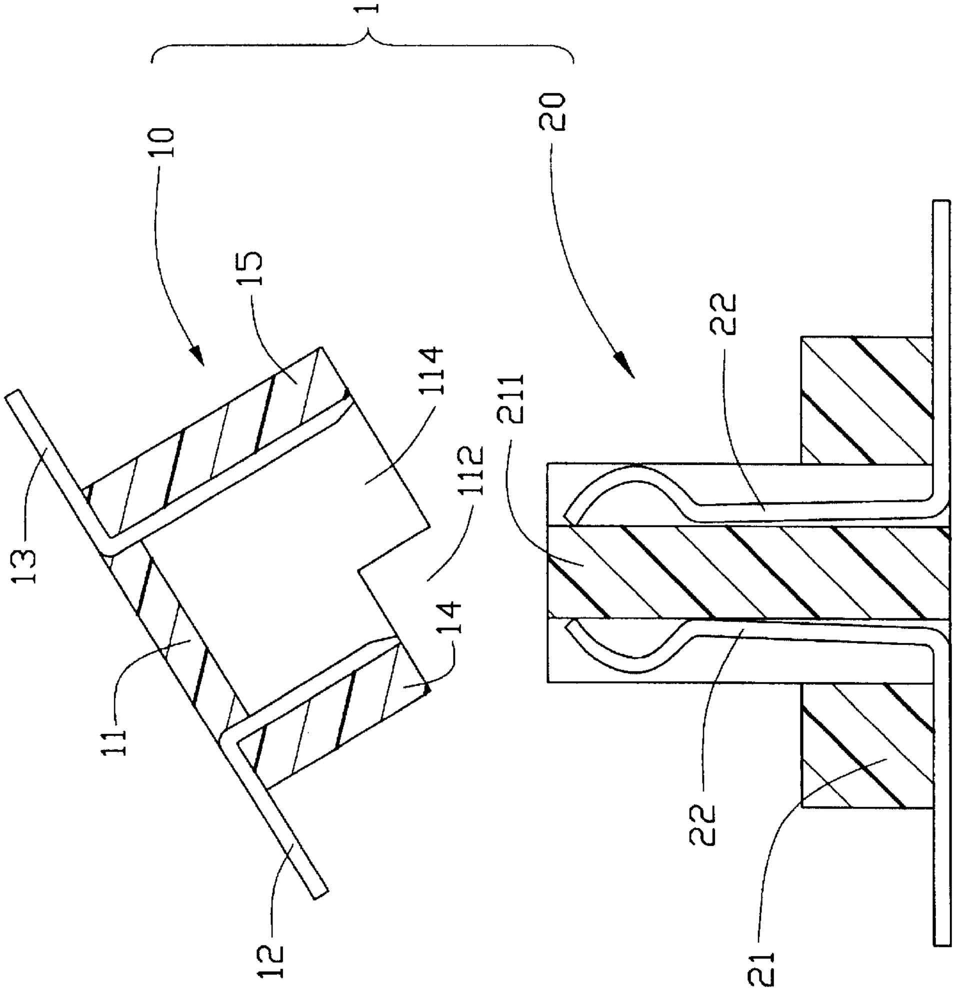
FIGS. 6A–6C are cross-sectional views of the connector couple showing the plug connector to be rotatably mated with the receptacle connector.
Figure 6B:
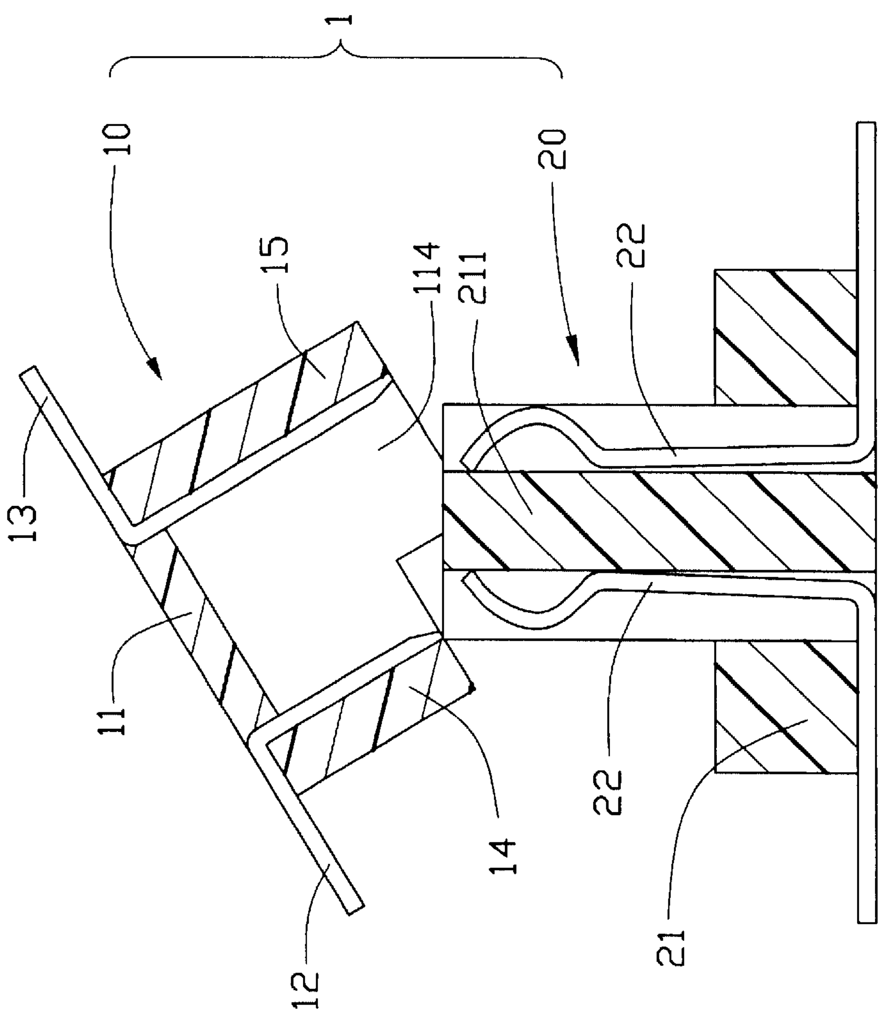
Figure 6C:
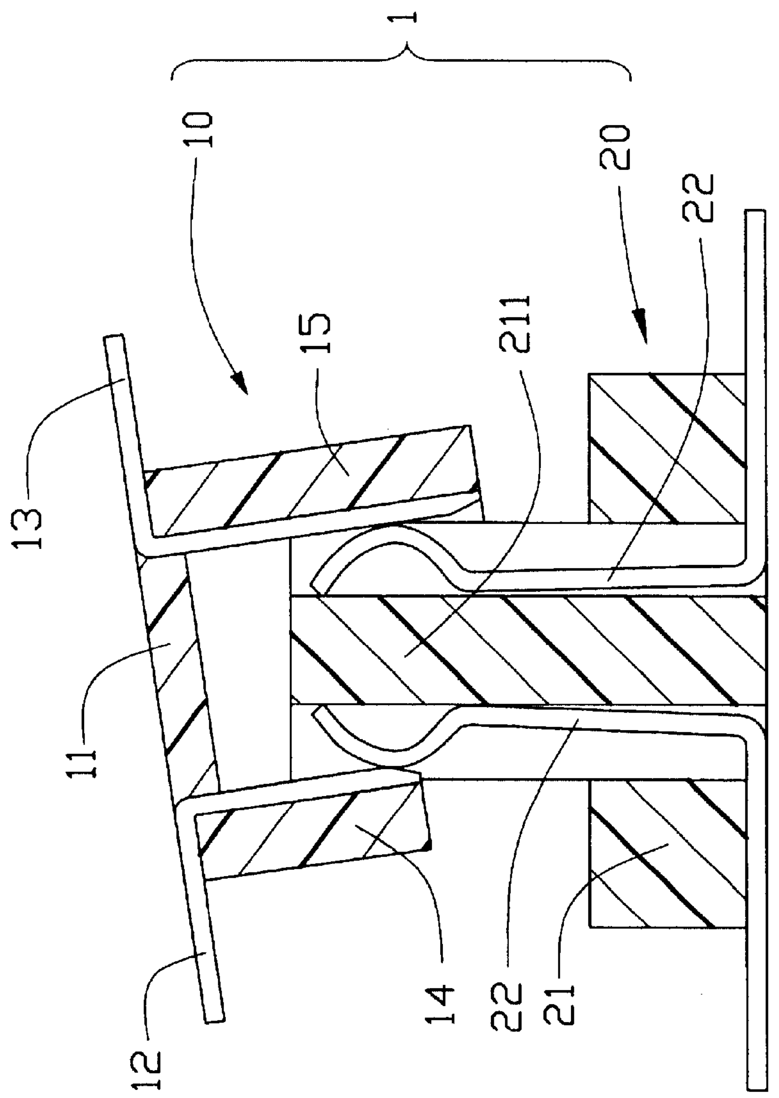
Figure 7:
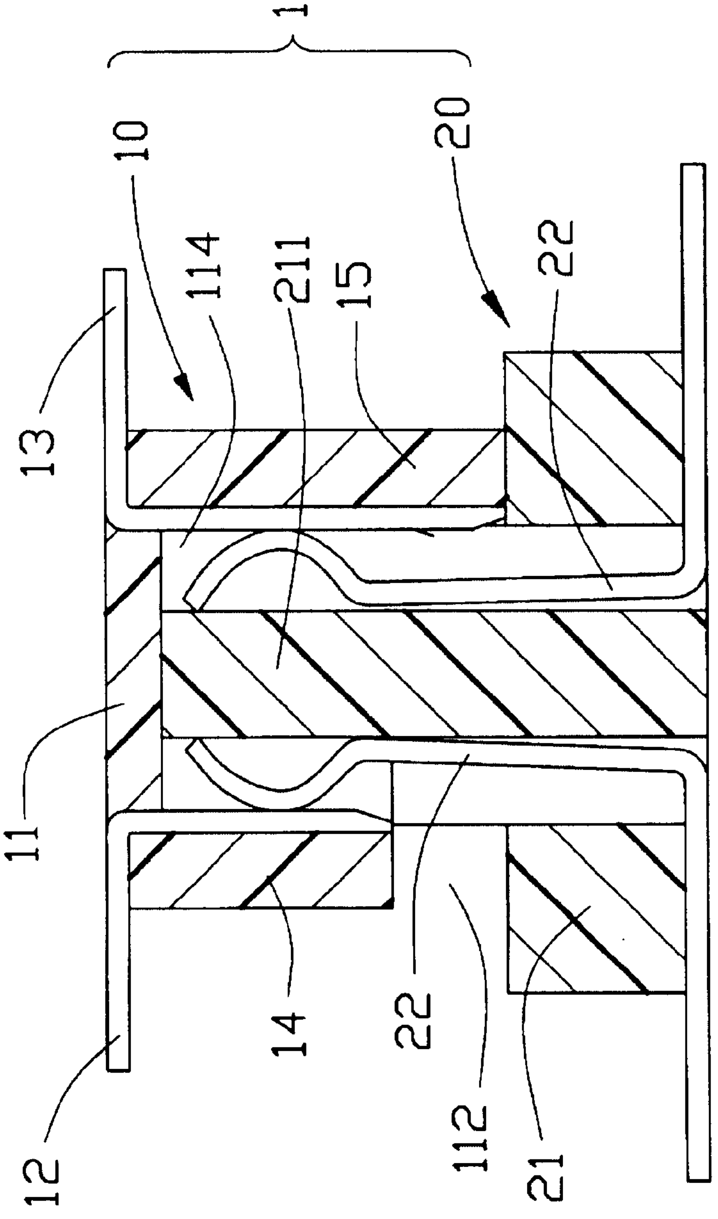
FIG. 7 is an assembled view of FIG. 6.

Referring to FIGS. 6A–7, in assembly, the plug connector 10 is rotatably mated with the receptacle connector 20 due to the cutout 112 thereof. The cutout 112 of the plug connector 10 provides access to the protruding wall 211 of the receptacle connector 20 to extend into the slot 114 of the plug connector 10 during the plug connector 10 rotatably mating with the receptacle connector 20. The first and second terminals 12, 13 of the plug connector 10 mate with the terminals 22 of the receptacle connector 20, respectively.

Figure 8:
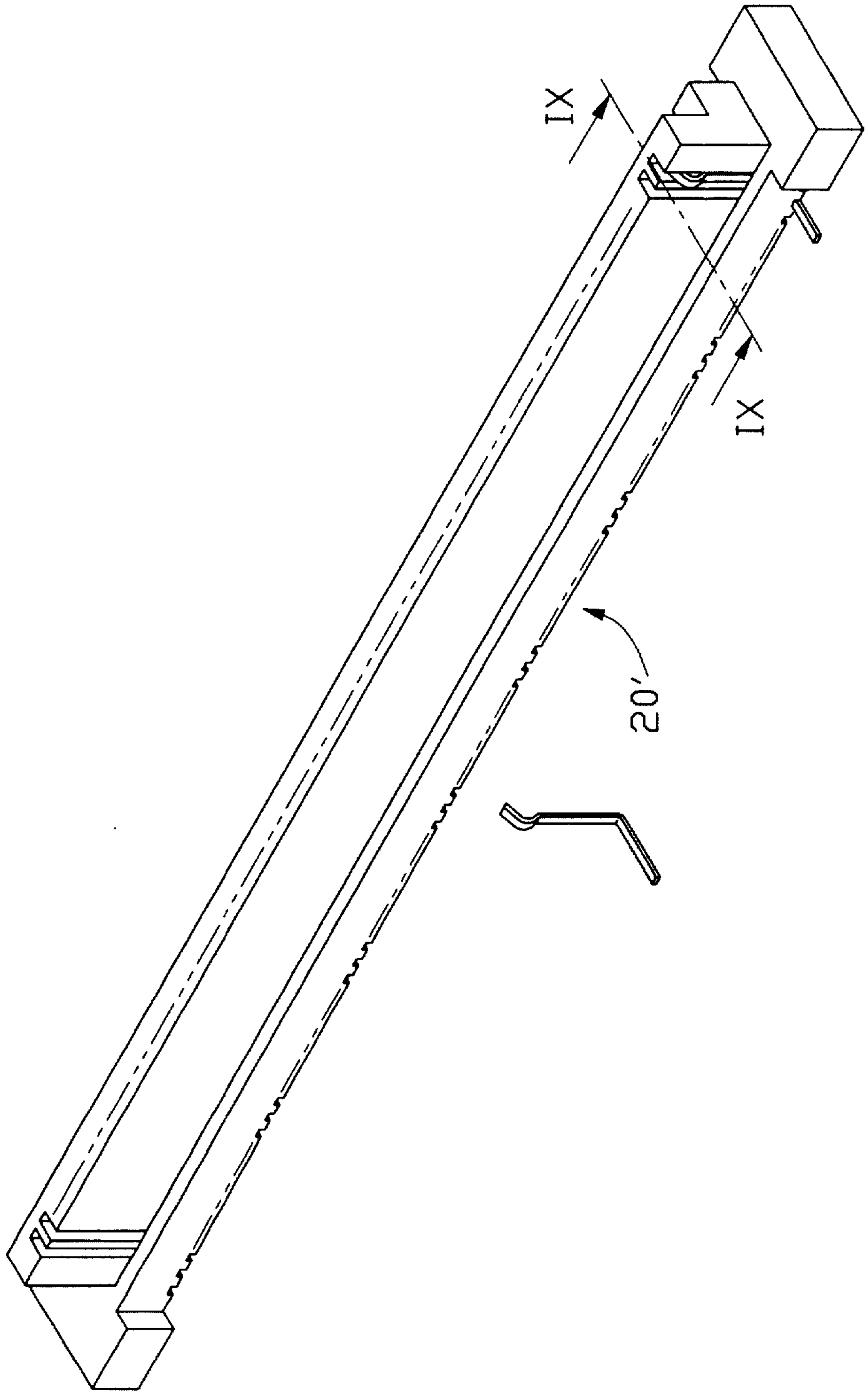
FIG. 8 is a perspective view of a receptacle connector in accordance with an alternative embodiment of the present invention.
Figure 9:
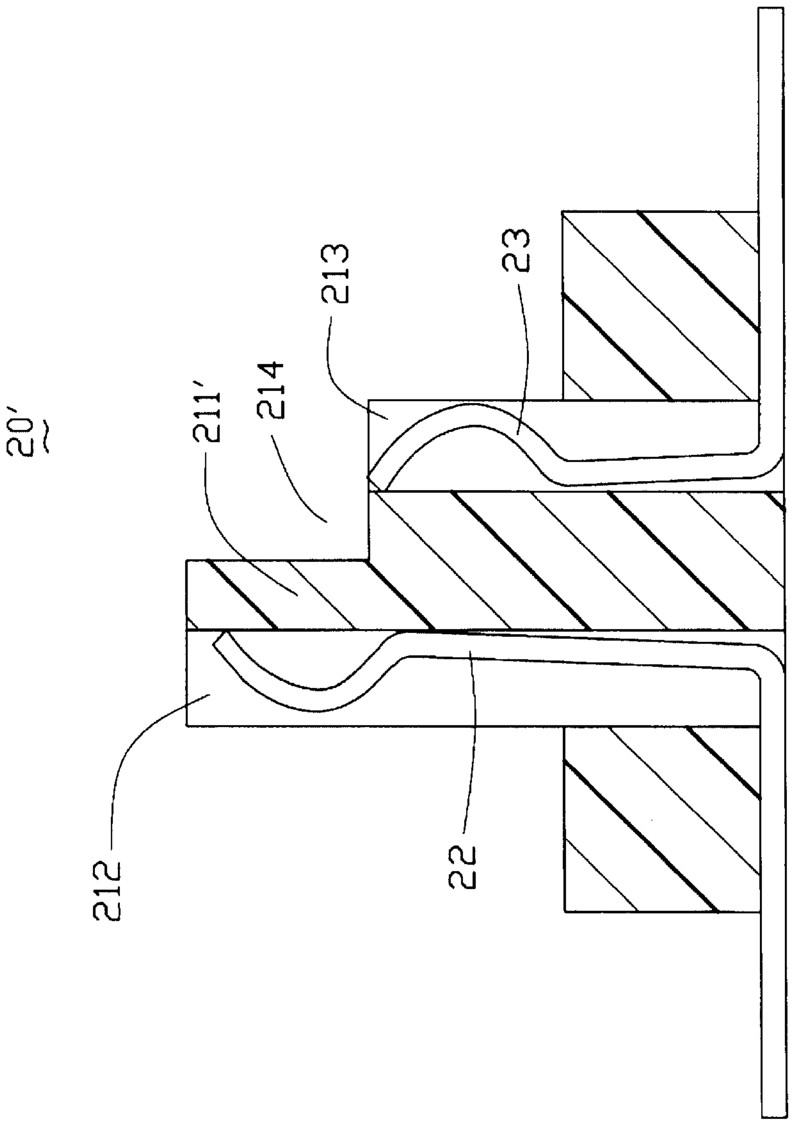
FIG. 9 is a crosssectional view taken along line IX—IX of FIG. 8.

Referring to FIGS. 8 and 9, a receptacle connector 20' in accordance with an alternative embodiment of the present invention is shown. The protruding wall 211' of the receptacle connector 20' defines opposite first and second passages 212, 213 and an elongate cutout 214 in communication with the second passages 213 and opposite the first passages 212. A plurality of first and second terminals 22, 23 is received in the first and second passages 212, 213, respectively.

Figure 10A:
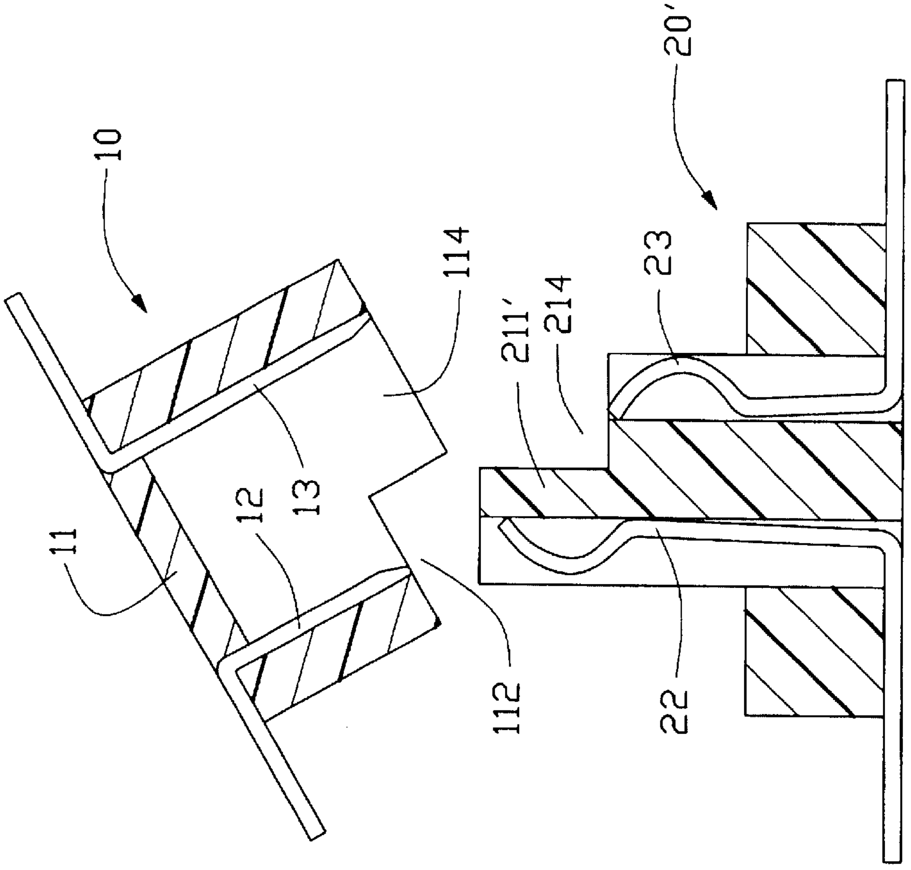
FIGS. 10A–10C are crosssectional views of a connector couple in accordance with an alternative embodiment of the present invention showing a plug connector to be rotatably mated with the receptacle connector of FIG. 8.
Figure 10B:
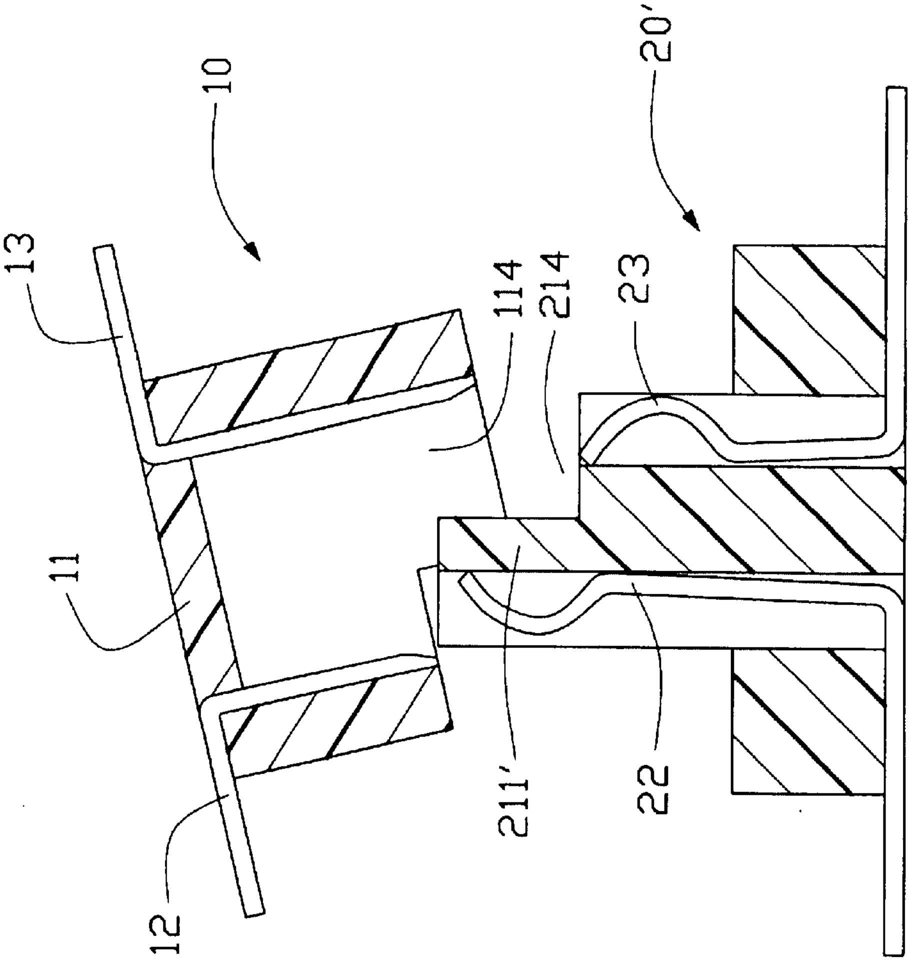
Figure 10C:
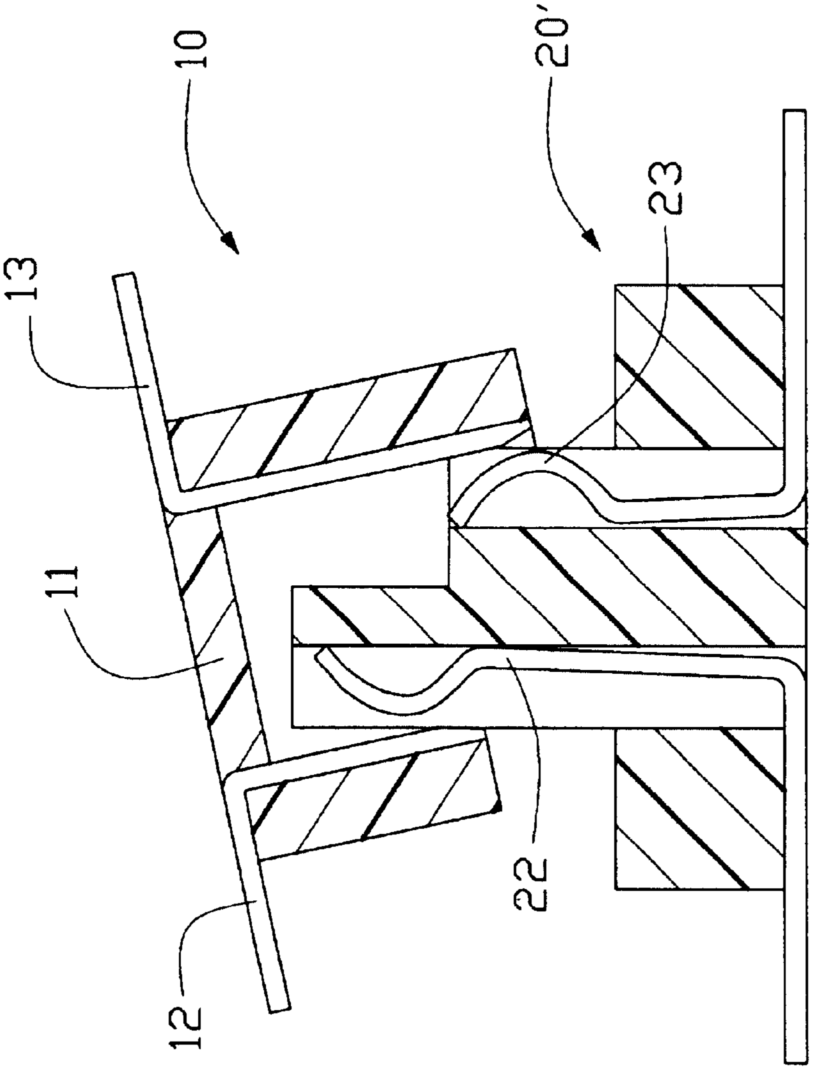
Figure 11:
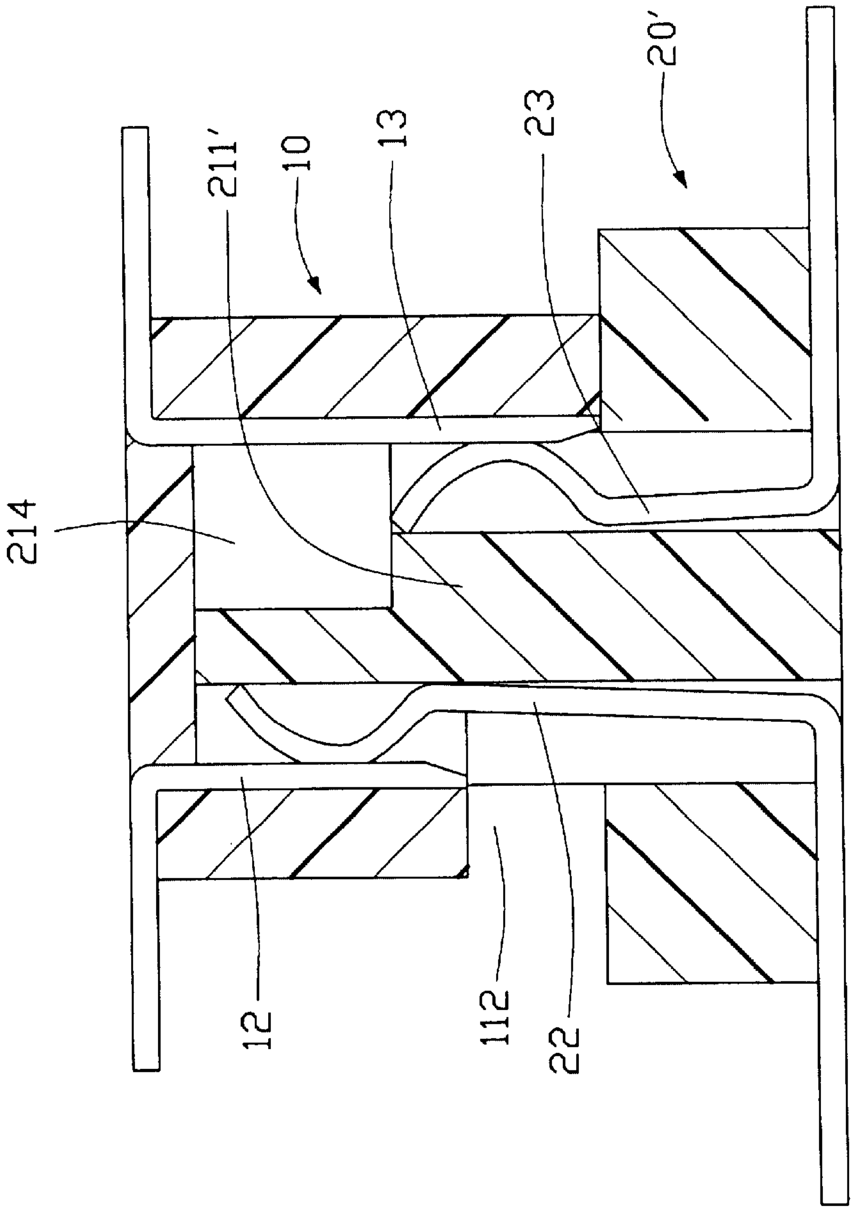
FIG. 11 is an assembled view of FIG. 10.

Referring to FIGS. 10A–11, in assembly, the plug connector 10 is rotatably mated with the receptacle connector 20' due to the cutout 112 thereof and the cutout 214 of the receptacle connector 20'. The cutout 112 of the plug connector 10 and the cutout 214 of the receptacle connector 20' cooperatively provide access to the protruding wall 211' of the receptacle connector 20' to extend into the slot 114 of the plug connector 10 during the plug connector 10 rotatably mating with the receptacle connector 20'. The first and second terminals 12, 13 of the plug connector 10 mate with the first and second terminals 22, 23 of the receptacle connector 20', respectively.

It is understood that the invention may be embodied in other forms without departing from the spirit thereof. Thus, the present example and embodiment is to be considered in all respects as illustrative and not restrictive, and the invention is not to be limited to the details given herein.

What is claimed is:

1. A board to board electrical connector couple for electrically connecting two circuit substrates, comprising:

a plug connector comprising a housing and a plurality of first and second terminals, the housing defining a cutout and a slot in communication with the cutout and therefore forming first and second side walls, the first and second terminals being received in inner sides of the first and second side walls respectively; and a receptacle connector comprising a housing and a plurality of terminals received in the housing, a protruding wall extending front the housing and being received in the slot of the plug connector;

wherein the cutout of the plug connector provides access for the protruding wall of the receptacle connector to extend into the slot of the plug connector during rotatable mating of the plug connector with the receptacle connector; wherein the protruding wall of the receptacle connector defines first and second passages and a cutout in communication with the second passages, the cutouts of the plug connector and those of the receptacle connector being opposite to each other.

2. The connector couple as claimed in claim 1, wherein the first side wall of the plug connector is shorter than the second side wall of the plug connector.

3. The connector couple as claimed in claim 1, wherein the protruding wall of the receptacle connector defines a plurality of passages at opposite sides thereof receiving the terminals of the receptacle connector therein.

4. The connector couple as claimed in claim 1, wherein the terminals of the receptacle connector comprise a plurality of first and second terminals received in the first and second passages of the receptacle connector.

5. A board to board electrical connector couple for electrically connecting two circuit substrates, comprising:

first and second connectors mated with each other in a vertical direction;

said first connector defining a first elongated horizontal insulative housing having an elongated vertical slot therein with a plurality of first contacts by two sides of said slot; and said second connector defining a second elongated horizontal insulative housing having an elongated vertical central protruding wall extending therefrom, with a plurality of second contacts by two sides of said protruding wall, said horizontal insulative housing being wider than said vertical central protruding wall in a horizontal direction perpendicular to said vertical direction; wherein said protruding wall is adapted to be received within said slot, and at least one of said slot and said protruding wall is cut off at one comer so as to allow an oblique initial mating with regard to said vertical direction instead of a vertical initial mating along said vertical direction; wherein both of said slot and said protruding wall are cut off at corners in a complementary manner when mated.

6. A board to board electrical connector couple for electrically connecting two circuit substrates, comprising:

first and second connectors mated with each other in a vertical direction;

said first connector defining a first elongated horizontal insulative housing having an elongated vertical slot therein with two opposite rows of contacts by two sides of said slot; and said second connector defining a second elongated horizontal insulative housing having an elongated vertical central protruding wall extending therefrom, with two opposite rows of contacts by two sides of said protruding wall, said horizontal insulative housing being wider than the vertical central protruding wall in a horizontal direction perpendicular to said vertical direction; wherein said protruding wall is adapted to be received within said slot, and the contacts in one row of at least one of said first and second connectors are shorter than those in the other row so as to allow an oblique initial mating with regard to said vertical direction instead of a vertical initial mating along said vertical direction; wherein both of said slot and said protruding wall are cut off at comers in a complementary manner when mated.

7. The couple as claimed in claim 6, wherein each of said first and second connectors have the contact in one row shorter than those in the other row to result in a complementary manner when mated.

* * * * *